(12) United States Patent
Harada et al.

(10) Patent No.: US 10,204,990 B2
(45) Date of Patent: Feb. 12, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yuichi Harada, Matsumoto (JP); Yasuyuki Hoshi, Matsumoto (JP); Akimasa Kinoshita, Matsumoto (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/279,673

(22) Filed: Sep. 29, 2016

(65) Prior Publication Data

US 2017/0018615 A1    Jan. 19, 2017

Related U.S. Application Data

(63) Continuation of application No. PCT/JP2015/072912, filed on Aug. 13, 2015.

(30) Foreign Application Priority Data

Sep. 9, 2014    (JP) .................................. 2014-183317

(51) Int. Cl.
*H01L 21/04* (2006.01)
*H01L 29/08* (2006.01)
(Continued)

(52) U.S. Cl.
CPC ........ *H01L 29/1608* (2013.01); *H01L 21/049* (2013.01); *H01L 21/0485* (2013.01);
(Continued)

(58) Field of Classification Search
CPC ... H01L 21/0485; H01L 21/049; H01L 29/08; H01L 29/1608; H01L 29/41741;
(Continued)

(56) References Cited

U.S. PATENT DOCUMENTS 5,508,534 A    4/1996 Nakamura et al.
6,821,886 B1   11/2004 Layadi et al.
(Continued)

FOREIGN PATENT DOCUMENTS

JP    H07-235676 A    9/1995
JP    2000-164862 A   6/2000
(Continued)

*Primary Examiner* — Ori Nadav
*Assistant Examiner* — Vernon P Webb
(74) *Attorney, Agent, or Firm* — Rabin & Berdo, P.C.

(57) ABSTRACT

A semiconductor device includes an N-type silicon carbide substrate, an N-type silicon carbide layer formed on the N-type silicon carbide substrate, a P-type region selectively formed in a surface layer of the N-type silicon carbide layer, an N-type source region formed in the P-type region, a P contact region formed in the P-type region, a gate insulating film formed on a portion of a region from the N-type source region, through the P-type region, to the N-type silicon carbide layer, a gate electrode formed on the gate insulating film, an interlayer insulating film covering the gate electrode, and a first source electrode electrically connected to a surface of the P contact region and the N-type source region. An end of the interlayer insulating film covering the gate electrode has a slope of a predetermined angle.

7 Claims, 7 Drawing Sheets

(51) Int. Cl.
  *H01L 29/16* (2006.01)
  *H01L 29/41* (2006.01)
  *H01L 29/66* (2006.01)
  *H01L 29/78* (2006.01)
  *H01L 29/417* (2006.01)
  *H01L 29/45* (2006.01)

(52) U.S. Cl.
  CPC .... *H01L 29/0847* (2013.01); *H01L 29/41741* (2013.01); *H01L 29/45* (2013.01); *H01L 29/66068* (2013.01); *H01L 29/66666* (2013.01); *H01L 29/7827* (2013.01)

(58) Field of Classification Search
  CPC ............... H01L 29/45; H01L 29/66068; H01L 29/66666; H01L 29/7827
  USPC ........................................................ 257/77
  See application file for complete search history.

(56) References Cited

U.S. PATENT DOCUMENTS

| | | | |
|---|---|---|---|
| 9,960,235 | B2 | 5/2018 | Hoshi et al. |
| 2005/0127810 | A1 | 6/2005 | Fukuhara et al. |
| 2008/0102585 | A1* | 5/2008 | Nakamura ............ H01L 21/049 438/285 |
| 2008/0315211 | A1 | 12/2008 | Ichikawa et al. |
| 2010/0140697 | A1 | 6/2010 | Yedinak et al. |
| 2011/0233666 | A1 | 9/2011 | Lui et al. |
| 2012/0193702 | A1 | 8/2012 | Machida et al. |
| 2013/0062624 | A1 | 3/2013 | Tsuchiya et al. |
| 2014/0299887 | A1* | 10/2014 | Matocha ................. H01L 23/26 257/77 |
| 2015/0001553 | A1 | 1/2015 | Kudou et al. |

FOREIGN PATENT DOCUMENTS

| | | |
|---|---|---|
| JP | 2005-338746 A | 12/2005 |
| JP | 2008-112824 A | 5/2008 |
| JP | 2009-004573 A | 1/2009 |
| JP | 2009-043880 A | 2/2009 |
| JP | 2012-160509 A | 8/2012 |
| JP | 2013-058603 A | 3/2013 |
| JP | 2013-232560 A | 11/2013 |
| JP | 2014-082519 A | 5/2014 |
| WO | WO 2014-068813 A1 | 5/2014 |

\* cited by examiner (a)

(b)

(c)

(d)

(e)

(a)

(b)

(c)

(d)

(e)

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/072912 filed on Aug. 13, 2015 which claims priority from a Japanese Patent Application No. 2014-183317 filed on Sep. 9, 2014, the contents of which are incorporated herein by reference.

BACKGROUND OF THE INVENTION

1. Field of the Invention

The embodiments discussed herein relate to a semiconductor device and method of manufacturing a semiconductor device used as a switching device formed on a silicon carbide substrate.

2. Description of the Related Art

FIG. 13 is a cross-sectional view of an N-channel MOSFET that is a conventional switching device formed of silicon carbide. On a front surface side of an N-type silicon carbide (hereinafter, SiC) substrate 1, an N-type SiC layer 2 is formed and in a surface layer of the N-type SiC layer 2, plural P-type regions 3 are formed. In a surface layer of the P-type region 3, an N-type source region 4 and a P contact region 5 are formed. On a surface of the P-type region 3 and the N-type SiC layer 2 between N-type source regions 4, a gate electrode 7 is formed via a gate insulating film 6. On a surface of the gate electrode 7, an interlayer insulating film 8 is formed. On a surface of the N-type source region 4 and the P contact region 5, a first source electrode 9 is formed using nickel (Ni), and on a surface of the first source electrode 9 and the interlayer insulating film 8, a second source electrode 10 is formed. On a back surface side of the N-type SiC substrate 1, a drain electrode 11 is formed.

FIG. 14 is a cross-sectional view of a conventional N-channel MOSFET formed using a P-type SiC layer on a surface. On a front surface side of the N-type SiC substrate 1, the N-type SiC layer 2 is formed and in a surface layer of the N-type SiC layer 2, plural P-type regions 12 are formed. In a surface layer of the P-type region 12, a P-type SiC layer 13 is formed. On the N-type SiC layer 2 where no P-type region 12 is formed, an N-type region 14 is formed in the P-type SiC layer 13 and in the surface of the P-type SiC layer 13, the N-type source region 4 and the P contact region 5 are formed. On a surface of the N-type SiC layer 2 and the P-type SiC layer 13 between N-type source regions 4, the gate electrode 7 is formed via the gate insulating film 6. On a surface of the gate electrode 7, the interlayer insulating film 8 is formed. On the surface of the N-type source region 4 and the P contact region 5, the first source electrode 9 is formed using Ni, and on the surface of the first source electrode 9 and the interlayer insulating film 8, the second source electrode 10 is formed. On the back surface side of the N-type SiC substrate 1, the drain electrode 11 is formed.

In the MOSFETs of the structures depicted in FIGS. 13 and 14, when positive voltage relative to the first source electrode 9 is applied to the drain electrode 11 and voltage less than the gate threshold voltage is applied to the gate electrode 7, a PN junction between the P-type region 3 and the N-type SiC layer 2 or the P-type SiC layer 13 and the N-type region 14 is reverse biased and therefore, current does not flow. On the other hand, when voltage equal to or higher than the gate threshold is applied to the gate electrode 7, at the surface of the P-type SiC layer 13 of the P-type region 3 directly under the gate electrode 7, an inversion layer is formed, whereby current flows, enabling switching operation of the MOSFET by the voltage applied to the gate electrode 7 (for example refer to Japanese Patent Application Laid-Open Publication No. 2013-058603).

SUMMARY OF THE INVENTION

According to one aspect of the present invention, a semiconductor device includes a silicon carbide substrate of a first conductivity type; a silicon carbide layer of the first conductivity type, formed on a front surface side of the silicon carbide substrate and having a low concentration; a first region of a second conductivity type, selectively formed in a surface layer of the silicon carbide layer; a semiconductor region of the first conductivity type, formed in the first region; a gate insulating film formed so as to contact a region of the first region between the silicon carbide layer and the semiconductor region; a gate electrode disposed opposing the first region, across the gate insulating film; an interlayer insulating film covering the gate electrode; a barrier film covering the interlayer insulating film; and a source electrode formed to be electrically connected to a surface of the first region and the semiconductor region. An end of the barrier film and the interlayer insulating film covering the gate electrode has a slope of a predetermined angle.

In the semiconductor device, the slope of the barrier film and the interlayer insulating film is formed at a source contact hole portion.

In the semiconductor device, the gate electrode has a slope at an end portion, and the barrier film and the interlayer insulating film covering the gate electrode have a slope of a predetermined angle corresponding to the slope of the gate electrode.

In the semiconductor device, a slope angle of the slope of the barrier film and the interlayer insulating film is 25° to 75°.

Another aspect of the present invention relates to a method of manufacturing a semiconductor device that includes: a silicon carbide substrate of a first conductivity type; a silicon carbide layer of the first conductivity type, formed on a front surface of the silicon carbide substrate and having a low concentration; a first region of a second conductivity type, selectively formed in a surface layer of the silicon carbide layer; a semiconductor region of the first conductivity type, formed in the first region; a gate insulating film formed so as to contact a region of the first region between the silicon carbide layer and the semiconductor region; a gate electrode disposed opposing the first region, across the gate insulating film; an interlayer insulating film covering the gate electrode; a barrier film covering the interlayer insulating film; and a source electrode formed to be electrically connected to a surface of the first region and the semiconductor region. The method includes forming an end of the barrier film and the interlayer insulating film covering the gate electrode to have a slope of a predetermined angle.

The method further includes forming the gate insulating film and the gate electrode on the front surface side of the silicon carbide substrate; forming the interlayer insulating film so as to cover the gate electrode, after forming the gate insulating film and the gate electrode; forming the slope of the interlayer insulating film, near a source contact hole by heat treatment after forming the interlayer insulating film; forming the barrier film so as to cover the interlayer insulating film, after forming the slope; forming an Ni layer so as to cover the source contact hole portion, after forming the barrier film, the Ni layer becoming a first source electrode; forming an Ni silicide layer on a source contact surface by heat treatment after forming the Ni layer; and forming a second source electrode after forming the Ni silicide layer.

The method further includes forming the gate insulating film on the front surface side of the silicon carbide substrate and forming the gate electrode to have a slope at an end portion; forming the interlayer insulating film so as to cover the gate electrode, after forming the gate insulating film and the gate electrode; forming the barrier film so as to cover the interlayer insulating film, after forming the interlayer insulating film; forming an Ni layer so as to cover the source contact hole portion, after forming the barrier film, the Ni layer becoming a first source electrode; forming an Ni silicide layer on a source contact surface by heat treatment after forming the Ni layer; and forming a second source electrode after forming the Ni silicide layer.

Objects, features, and advantages of the present invention are specifically set forth in or will become apparent from the following detailed description of the invention when read in conjunction with the accompanying drawings.

DETAILED DESCRIPTION OF THE INVENTION

Embodiments of a semiconductor device and a method of manufacturing a semiconductor device according to the present invention will be described in detail with reference to the accompanying drawings.

Figure 1:
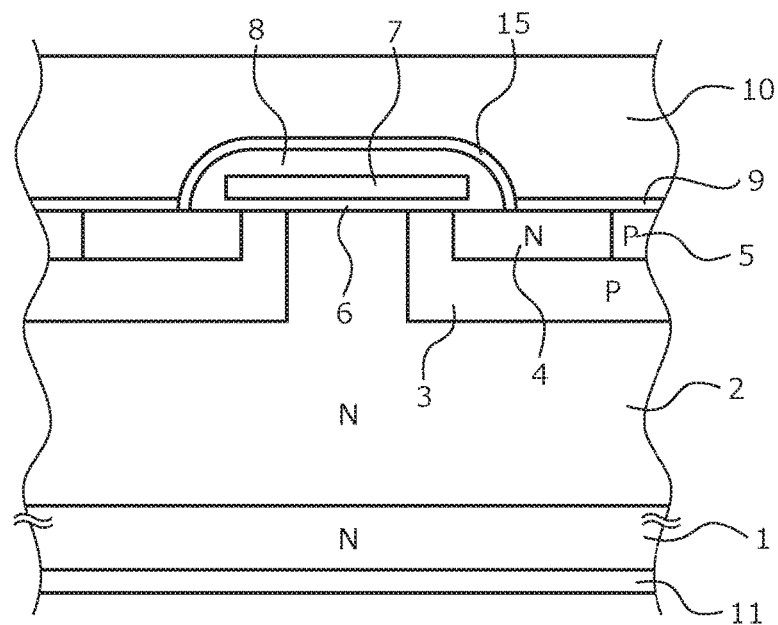
FIG. 1 is a cross-sectional view of a MOSFET in a first embodiment of a semiconductor device according to the present invention.

FIG. 1 is a cross-sectional view of a MOSFET in a first embodiment of the semiconductor device according to the present invention. In the present embodiments, although a first conductivity type is assumed to be an N-type and a second conductivity type is assumed to be a P-type, these types may be formed inversely.

On a front surface side of an N-type SiC substrate 1, a low-concentration N-type SiC layer 2 is formed and in a surface layer of the N-type SiC layer 2, plural P-type regions 3 are formed. In a surface layer of the P-type regions 3, an N-type source region 4 and a high-concentration P contact region 5 are formed. On a surface of the P-type region 3 and the N-type SiC layer 2 between N-type source regions 4, a gate electrode 7 is formed via a gate insulating film 6, and on a surface of the gate electrode 7, an interlayer insulating film 8 and a barrier film 15 are formed by layers of titanium nitride (TiN), or titanium (Ti)/TiN.

On a surface of the N-type source region 4 and the P contact region 5, a first source electrode 9 is formed by an Ni silicide layer, and on a surface of the barrier film 15 and the first source electrode 9, a second source electrode 10 is formed by layers of Ti and aluminum (Al), or Al-silicon (Si), etc. On a back surface side of the N-type SiC substrate 1, a drain electrode 11 is formed.

In the interlayer insulating film 8, boron phosphorus silicon glass (BPSG) is used, contact reflow (heat treatment) is performed after source contact hole formation, and the interlayer insulating film 8 is provided with a slope near a contact hole and no flat portion is formed. The sloped aspect is not limited to a linear shape and as depicted in FIG. 1 may be a predetermined arc shape. In a conventional structure, the interlayer insulating film 8 has a flat portion next to the contact hole and during heat treatment to form the Ni silicide layer, excess Ni forms a mass and remains at this flat portion.

Concerning this point, in the first embodiment, no flat portion of the interlayer insulating film 8 is formed near the contact hole and therefore, during heat treatment, Ni moves into the contact hole via the slope of the interlayer insulating film 8. As a result, the Ni does not expand (occur) as a mass, whereby poor coverage of the second source electrode 10 formed thereafter is prevented and variation of device characteristics are suppressed and reliability may be improved.

In the MOSFET formed in this manner, similar to a conventional MOSFET, voltage equal to or higher than the threshold voltage is applied to the gate electrode whereby, an inversion layer is formed on the surface of the P-type region, enabling the MOSFET to be turned on.

FIGS. 2, 3, 4, 5, and 6 are cross-sectional views of the MOSFET in the first embodiment of the semiconductor device of the present invention during manufacture. Manufacture of the MOSFET is performed sequentially from (a) to (f).

Figure 2:
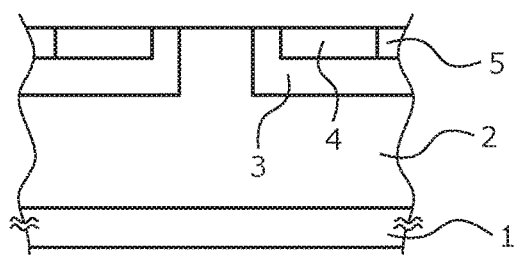
FIGS. 2, 3, 4, 5, and 6 are cross-sectional views of the MOSFET in the first embodiment of the semiconductor device of the present invention during manufacture.

(a) As depicted in FIG. 2, a device structure of the N-type SiC layer 2 to the P contact region 5 is formed in the N-type SiC substrate 1.

Figure 3:
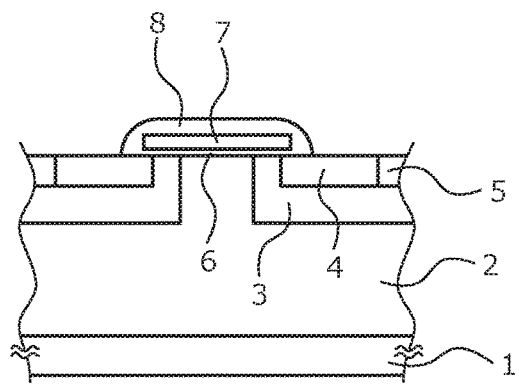

(b) As depicted in FIG. 3, on a front surface side of a base body (the N-type SiC substrate 1 and the N-type SiC layer 2), the gate insulating film 6 and the gate electrode 7 are formed, and the interlayer insulating film 8 is formed using BPSG. Thereafter, reflow is performed at a temperature of 800 degrees C. or higher and equal to or higher than for heat treatment to form a Ni silicide, and the interlayer insulating film 8 is formed to be sloped near the contact hole. Here, the slope angle of the interlayer insulating film 8 may be a range of 25° to 75°.

Figure 4:
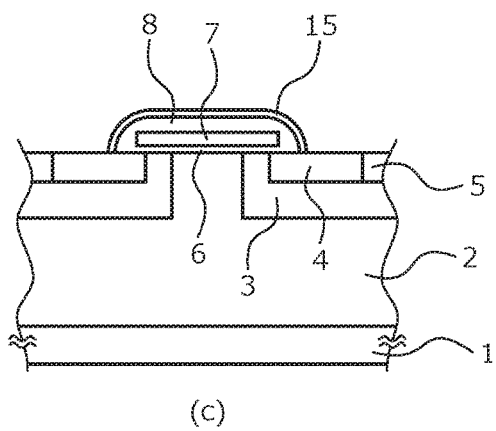

(c) As depicted in FIG. 4, the barrier film 15 is formed by a single layer of TiN or a layered film of Ti/TiN so as to cover the interlayer insulating film 8.

Figure 5:
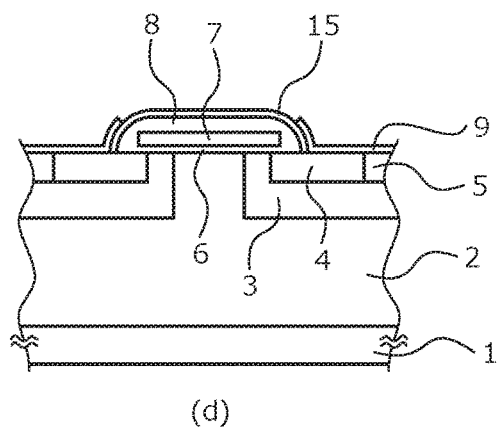

(d) As depicted in FIG. 5, Ni is formed so as to cover a contact hole portion and becomes the first source electrode 9.

Figure 6:
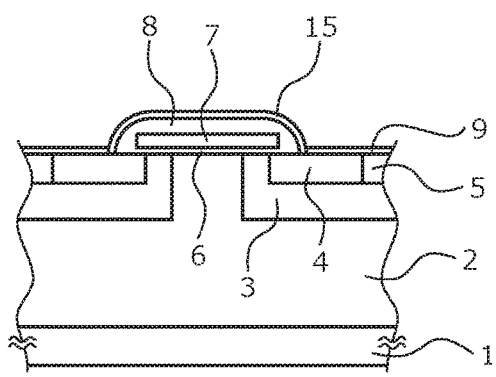

(e) As depicted in FIG. 6, heat treatment of 900 to 1200 degrees C. to form an Ni silicide layer on a source contact surface is performed.

(f) The second source electrode 10 is formed and the drain electrode 11 is formed on the back surface side, whereby the MOSFET device structure depicted in FIG. 1 is obtained.

The processes described prevent the occurrence of excess Ni, enabling a process of removing excess Ni to be omitted when a vertical MOSFET is formed. Further, poor coverage of the second source electrode 10 is prevented, enabling variation of device characteristics to be suppressed and improved reliability to be facilitated.

Figure 7:
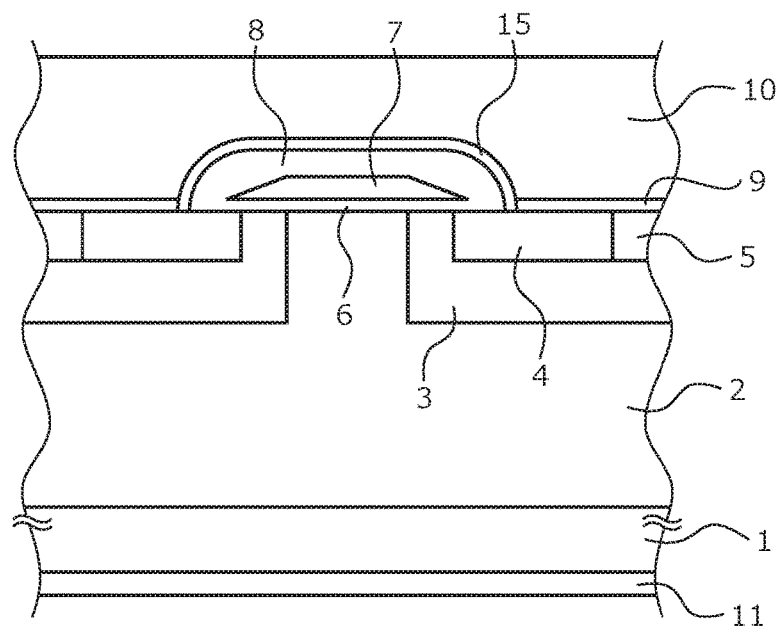
FIG. 7 is a cross-sectional view of a MOSFET in a second embodiment of the semiconductor device of the present invention.

FIG. 7 is a cross-sectional view of a MOSFET in a second embodiment of the semiconductor device of the present invention. The second embodiment differs from the first embodiment in that the gate electrode 7 is provided with a slope at an end portion. The gate electrode 7 having this slope enables the interlayer insulating film 8 covering the gate electrode 7 to also have a slope formed near the source contact hole, without the formation of the flat portion.

In the second embodiment, similar to the first embodiment, since the interlayer insulating film 8 is formed to have no flat portion near the contact hole, during heat treatment, Ni moves into the contact hole via the slope of the interlayer insulating film 8 and no expansion of an Ni mass occurs. As a result, poor coverage of the second source electrode 10 formed thereafter is prevented, enabling variation of device characteristics to be suppressed and improved reliability to be facilitated. In the MOSFET formed as described, similar to a conventional MOSFET, voltage equal to or higher than the threshold voltage is applied to the gate electrode whereby, an inversion layer is formed on the surface of the P-type region, enabling the MOSFET to be turned on.

FIGS. 8, 9, 10, 11, and 12 are cross-sectional views of the MOSFET in the second embodiment of the semiconductor device of the present invention during manufacture. Manufacture of the MOSFET is performed sequentially from (a) to (f).

Figure 8:
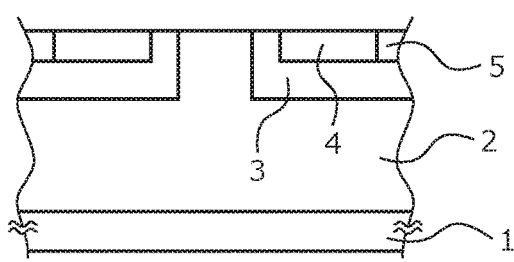
FIGS. 8, 9, 10, 11, and 12 are cross-sectional views of the MOSFET in the second embodiment of the semiconductor device of the present invention during manufacture.

(a) As depicted in FIG. 8, a device structure of the N-type SiC layer 2 to the P contact region 5 is formed in the N-type SiC substrate 1.

Figure 9:
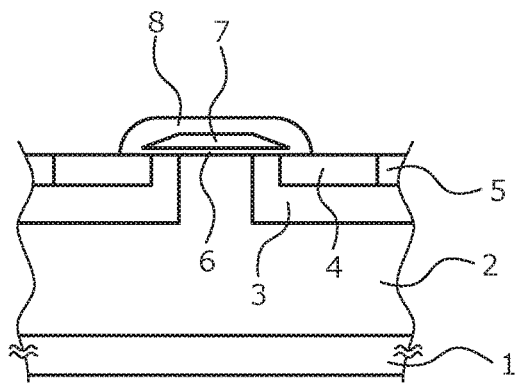

(b) As depicted in FIG. 9, the gate electrode 7 is formed to have a slope at an end portion, and the interlayer insulating film 8 is formed to cover the gate electrode 7. Since the gate electrode 7 forming a base of the interlayer insulating film 8 is sloped at the end portion, the interlayer insulating film 8 is also formed to be sloped.

Figure 10:
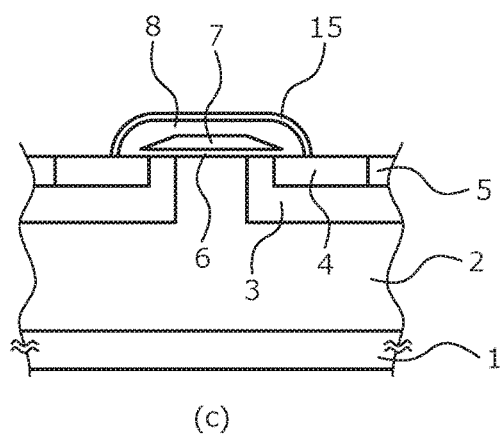

(c) As depicted in FIG. 10, the barrier film 15 is formed by a single layer of TiN or a layered film of Ti/TiN so as to cover the interlayer insulating film 8.

Figure 11:
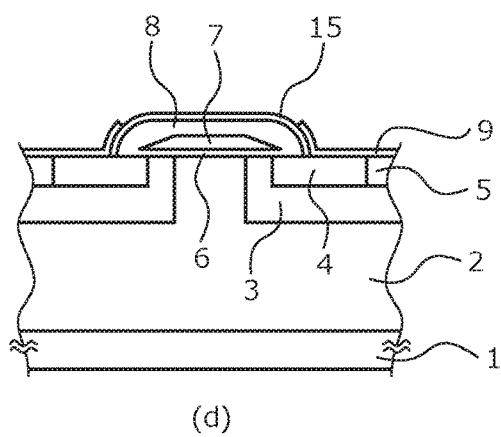

(d) As depicted in FIG. 11, Ni is formed so as to cover a contact hole portion and becomes the first source electrode 9.

Figure 12:
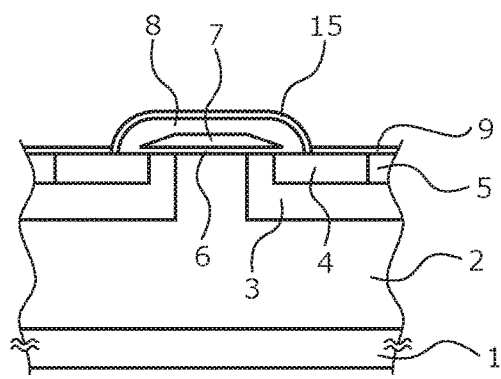

(e) As depicted in FIG. 12, heat treatment of 700 to 1200 degrees C. to form an Ni silicide layer on the source contact surface is performed.

(f) The second source electrode 10 is formed, whereby the MOSFET device structure depicted in FIG. 7 is obtained.

The processes described prevent the occurrence of excess Ni, enabling a process of removing excess Ni to be omitted when a vertical MOSFET is formed. Further, poor coverage of the second source electrode 10 is prevented, enabling variation of device characteristics to be suppressed and improved reliability to be facilitated.

According to the embodiments described above, in the MOSFET formed on the silicon carbide substrate, the interlayer insulating film covering the gate electrode is formed to be sloped near a contact portion and to have no flat areas near the contact portion. As a result, after heat treatment for forming a silicide, the occurrence of excess source electrode masses on the barrier film and/or the interlayer insulating film may be prevented. Further, coverage of the second source electrode formed on the front surface side may be improved, variation of characteristics may be suppressed, and reliability may be improved.

The present invention is not limited to the vertical MOSFET described and is similarly applicable to a MOSFET of a drain structure.

In contrast, with the conventional MOSFET described, to reduce the contact resistance with the SiC, a Ni silicide layer is formed as the first source electrode 9. In the manufacturing process for the first source electrode 9, after a Ni film is formed, the Ni silicide layer is formed by high-temperature heat treatment (700 to 1200 degrees C.). However, when Ni is present on the interlayer insulating film 8 other than at the contact portion or on the barrier film, a problem of excess Ni remaining occurs.

Figure 13:
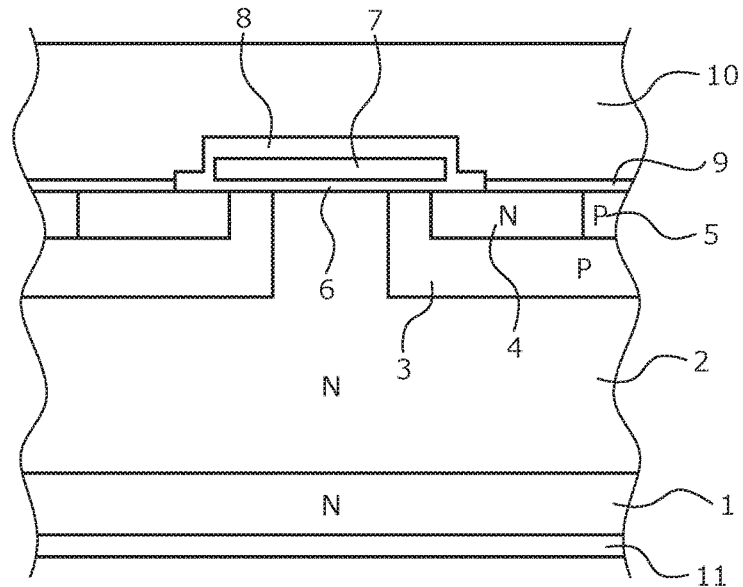
FIG. 13 is a cross-sectional view of an N-channel MOSFET that is a conventional switching device formed of silicon carbide.
Figure 14:
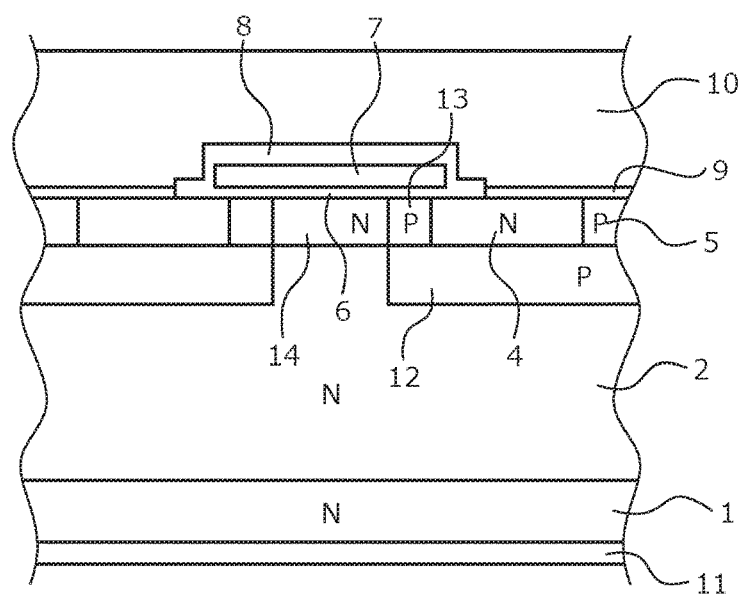
FIG. 14 is a cross-sectional view of a conventional N-channel MOSFET formed using a P-type SiC layer on a surface.
Figure 15:
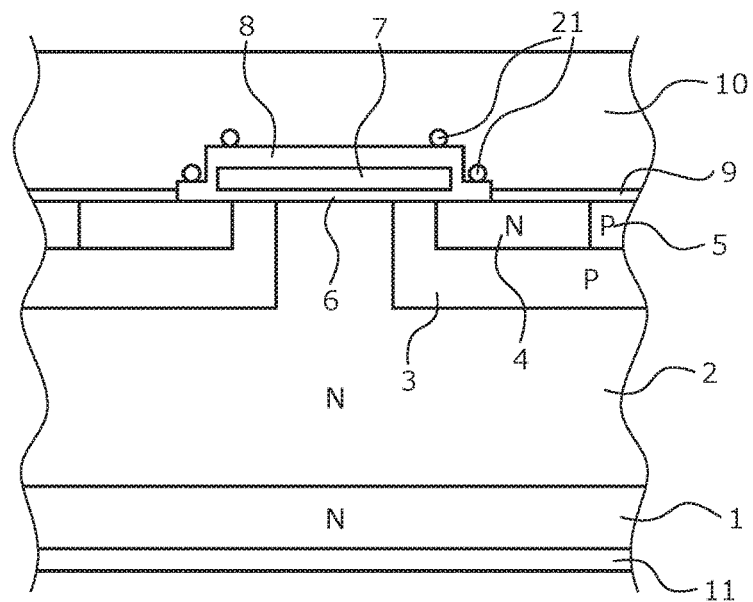
FIGS. 15 and 16 are cross-sectional views describing a problem of excess Ni occurring in the conventional MOSFET.
Figure 16:
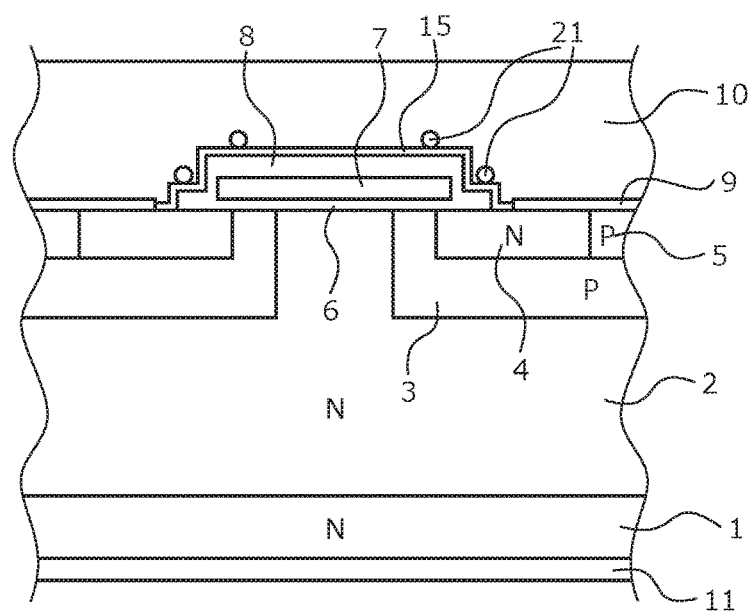
Figure 17:
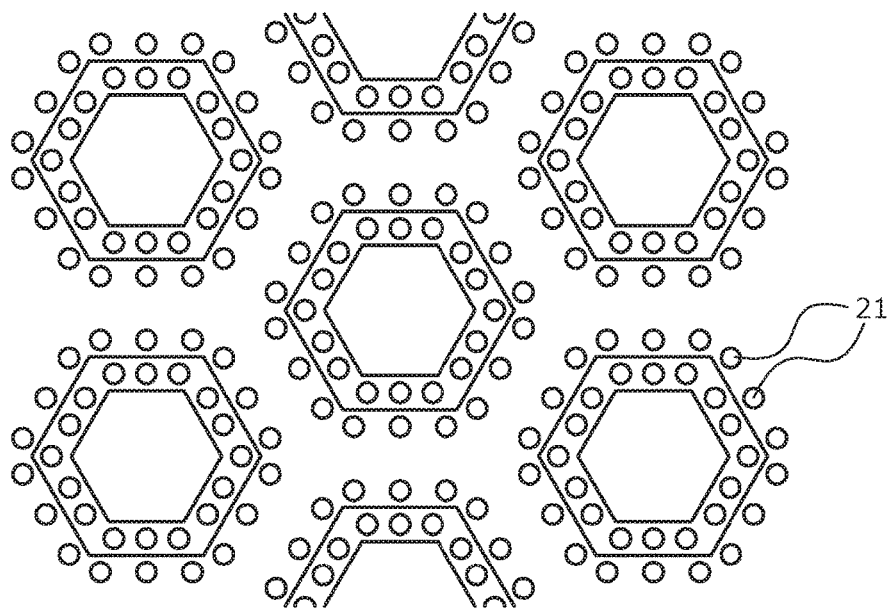
FIG. 17 is a plan diagram corresponding to FIG. 15.

FIGS. 15 and 16 are cross-sectional views describing the problem of excess Ni occurring in the conventional MOSFET. FIG. 17 is a plan diagram corresponding to FIG. 15. FIG. 16 is a diagram corresponding to a configuration in which the configuration depicted in FIG. 13 is provided the barrier film 15. As depicted in FIGS. 15 to 17, on the interlayer insulating film 8 at portions other than the contact portion and on the barrier film, excess Ni 21 forms masses and remains. Therefore, at a subsequent manufacturing process, the coverage of a metal electrode such as Al or Al—Si and the insulating film formed on the front surface side become poor, whereby variation of characteristics of the MOSFET may occur and/or reliability of the MOSFET may become poor. In particular, variation of the threshold value increases consequent to poor coverage of Ti used in an active hydrogen blocking measure.

In contrast, according to the present invention, since interlayer insulating film covering the gate electrode is formed to be sloped and have no flat areas to the source contact portion, after heat treatment for forming a silicide, the occurrence of excess first source electrode masses on the barrier film and/or the interlayer insulating film may be prevented. As a result, coverage of a second source electrode formed on the interlayer insulating film may be improved, enabling variation of characteristics to be suppressed and reliability to be improved.

According to the present invention, coverage of a metal electrode formed on the front surface side may be improved, enabling variation of characteristics to be suppressed and reliability to be improved.

As described, the semiconductor device and the method of manufacturing a semiconductor device according to the present invention are useful for high-voltage semiconductors used in used in power converting equipment, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
   a silicon carbide substrate of a first conductivity type;
   a silicon carbide layer of the first conductivity type, formed on a front surface side of the silicon carbide substrate and having a low concentration;
   a first region of a second conductivity type, selectively formed in a surface layer of the silicon carbide layer;
   a semiconductor region of the first conductivity type, formed in the first region;

a gate insulating film formed so as to contact a region of the first region between the silicon carbide layer and the semiconductor region;

a gate electrode disposed opposing the first region, across the gate insulating film;

an interlayer insulating film covering the gate electrode;

a barrier film formed by titanium nitride or titanium/titanium nitride and covering the interlayer insulating film;

a first source electrode formed by a nickel silicide layer and formed to be electrically connected to a surface of the first region and the semiconductor region; and a second source electrode formed on a surface of the barrier film and the first source electrode, wherein an end of the barrier film and the interlayer insulating film covering the gate electrode has a slope of a predetermined angle, the slope being continuous and concave from a point above the gate electrode to a point where the barrier film contacts the semiconductor region of the first conductivity type when the slope is viewed from a region in the second source electrode in a direction toward the semiconductor region of the first conductivity type.

2. The semiconductor device according to claim 1, wherein
the slope of the barrier film and the interlayer insulating film is formed at a source contact hole portion.

3. The semiconductor device according to claim 1, wherein
the gate electrode has a slope at an end portion, the slope of the gate electrode at the end portion continuously declining from a substantially flat upper surface of the gate electrode.

4. The semiconductor device according to claim 1, wherein
a slope angle of the slope of the barrier film and the interlayer insulating film is 25° to 75°.

5. A method of manufacturing a semiconductor device, wherein the semiconductor device comprises:

a silicon carbide substrate of a first conductivity type;

a silicon carbide layer of the first conductivity type, formed on a front surface of the silicon carbide substrate and having a low concentration;

a first region of a second conductivity type, selectively formed in a surface layer of the silicon carbide layer;

a semiconductor region of the first conductivity type, formed in the first region;

a gate insulating film formed so as to contact a region of the first region between the silicon carbide layer and the semiconductor region;

a gate electrode disposed opposing the first region, across the gate insulating film;

an interlayer insulating film covering the gate electrode;

a barrier film formed by titanium nitride or titanium/titanium nitride and covering the interlayer insulating film;

a first source electrode formed by a nickel silicide layer and formed to be electrically connected to a surface of the first region and the semiconductor region; and a second source electrode formed on a surface of the barrier film and the first source electrode, the method of manufacturing a semiconductor device comprising:

forming an end of the barrier film and the interlayer insulating film covering the gate electrode to have a slope of a predetermined angle, the slope being continuous and concave from a point above the gate electrode to a point where the barrier film contacts the semiconductor region of the first conductivity type when the slope is viewed from a region in the second source electrode in a direction toward the semiconductor region of the first conductivity type.

6. The method of manufacturing a semiconductor device according to claim 5, further comprising:

forming the gate insulating film and the gate electrode on a front surface side of the silicon carbide substrate;

forming the interlayer insulating film so as to cover the gate electrode, after forming the gate insulating film and the gate electrode;

forming the slope of the interlayer insulating film, near a source contact hole portion by heat treatment after forming the interlayer insulating film;

forming the barrier film so as to cover the interlayer insulating film, after forming the slope;

forming an Ni layer so as to cover the source contact hole portion, after forming the barrier film, the Ni layer becoming the first source electrode;

forming an Ni silicide layer on a source contact surface by heat treatment after forming the Ni layer; and forming the second source electrode after forming the Ni silicide layer.

7. The method of manufacturing a semiconductor device according to claim 5, further comprising:

forming the gate insulating film on the front surface side of the silicon carbide substrate and forming the gate electrode to have a slope at an end portion;

forming the interlayer insulating film so as to cover the gate electrode, after forming the gate insulating film and the gate electrode;

forming the barrier film so as to cover the interlayer insulating film, after forming the interlayer insulating film;

forming an Ni layer so as to cover a source contact hole portion, after forming the barrier film, the Ni layer becoming the first source electrode;

forming an Ni silicide layer on a source contact surface by heat treatment after forming the Ni layer; and forming the second source electrode after forming the Ni silicide layer.

* * * * *